United States Patent [19]

Pouliquen

[11] Patent Number: 5,087,297

[45] Date of Patent: Feb. 11, 1992

[54] ALUMINUM TARGET FOR MAGNETRON SPUTTERING AND METHOD OF MAKING SAME

[75] Inventor: Benoit Pouliquen, Spokane, Wash.

[73] Assignee: Johnson Matthey Inc., Valley Forge, Pa.

[21] Appl. No.: 642,670

[22] Filed: Jan. 17, 1991

[51] Int. Cl.⁵ .................... C22F 1/04; C23C 14/00
[52] U.S. Cl. .................... 148/2; 148/11.5 A; 148/437; 148/438; 204/298.13
[58] Field of Search ............ 148/2, 11.5 A, 437, 148/438; 204/298.02, 298.12, 298.13

[56] References Cited

U.S. PATENT DOCUMENTS

| | | | |
|---|---|---|---|
| 4,072,593 | 2/1978 | Diehl et al. | 204/192 F |
| 4,281,041 | 7/1981 | Koehler | 428/336 |
| 4,364,792 | 12/1982 | Gliem et al. | 156/628 |
| 4,883,686 | 11/1989 | Doehler et al. | 427/38 |
| 4,889,772 | 12/1989 | Bergmann et al. | 428/547 |
| 4,960,071 | 10/1990 | Akahori et al. | 118/722 |
| 4,961,831 | 10/1990 | Bergmann et al. | 204/192.16 |
| 4,961,832 | 10/1990 | Shagun et al. | 204/298.07 |
| 4,962,461 | 10/1990 | Meyer et al. | 364/482 |
| 4,963,239 | 10/1990 | Shimamure et al. | 204/192.12 |
| 4,963,240 | 10/1990 | Fukasawa et al. | 204/192.15 |
| 4,963,524 | 10/1990 | Yamazaki | 505/1 |
| 4,964,962 | 10/1990 | Nobutani et al. | 204/192.3 |
| 4,964,968 | 10/1990 | Arita | 204/298.19 |
| 4,964,969 | 10/1990 | Kusakabe et al. | 204/298.12 |
| 4,965,248 | 10/1990 | Poppe et al. | 505/1 |
| 4,966,668 | 10/1990 | Veistinen | 204/192.31 |
| 4,966,676 | 10/1990 | Fukasawa et al. | 204/298.12 |
| 4,966,677 | 10/1990 | Aichert et al. | 204/298.210 |
| 4,968,665 | 11/1990 | Ohuchi et al. | 505/1 |
| 4,969,956 | 11/1990 | Kreider et al. | 136/201 |
| 4,971,667 | 11/1990 | Yamazaki et al. | 204/192.32 |
| 4,971,674 | 11/1990 | Hata | 204/192.120 |
| 4,972,285 | 11/1990 | Otomo et al. | 360/120 |
| 5,032,468 | 7/1991 | Dumont et al. | 204/298.13 |

FOREIGN PATENT DOCUMENTS 0281141  9/1988  European Pat. Off. ....... 204/298.13

OTHER PUBLICATIONS

J. Vac. Sci. Technol. A5(4), Jul./Aug. 1987, pp. 1754–1757, Crystallographic Target Effects in Magnetron Sputtering.

J. Vac. Sci. Technol. A7 May/Jun. 1989, American Vacuum Society, Drift in Film Uniformity Arising from Sputtering Target Recrystallization.

Aluminum Alloys for Present and Future Devices, by Daniel R. Marx published by the Materials Research Corporation (1990).

Primary Examiner—R. Dean
Assistant Examiner—Robert R. Koehler
Attorney, Agent, or Firm—Christie, Parker & Hale

[57] ABSTRACT

An aluminum target which comprises a body of aluminum or aluminum alloy having a grain size of less than 2 mm and a near ideal <110> fiber texture; and a method of making an aluminum target for magnetron sputtering which comprises: providing a body of fine grain aluminum or aluminum alloy having a grain size of less than 2 mm; heating the body to an elevated forging temperature in the range of 550° F. to 900° F.; and slow forging the body at the rate of 0.5 to 4 inches per minute to produce a preferred grain orientation in the <110> direction.

5 Claims, 2 Drawing Sheets

ALUMINUM TARGET FOR MAGNETRON SPUTTERING AND METHOD OF MAKING SAME

BACKGROUND OF THE INVENTION

It is well known that thin metallic and ceramic layers may be deposited upon a substrate by a technique known as "magnetron sputtering". By such methods, a metal layer may be sputtered in an argon atmosphere using a target of the material to be deposited, generally as a cathode in a standard RF sputtering apparatus.

More recently, sputtering techniques have been used in the production of integrated circuits which require rapid and economical metal deposition with very close tolerances. Sputtering is an especially useful tool for the application of films and coatings where uniformity and chemical purity is important. Manufacturing costs may be lowered by improving film uniformity and deposition rate in high speed production processes typically used in integrated circuit manufacturing. Materials of particular importance in the manufacture of integrated circuits are aluminum and aluminum alloys. Targets of aluminum and/or aluminum alloys are used for sputtering to produce an aluminum film or coating on a substrate.

Sputtering processes and apparatus are disclosed in Bergmann et al., U.S. Pat. Nos. 4,889,772 and 4,961,831; Shagun et al., U.S. Pat. No. 4,961,832; Shimamura et al., U.S. Pat. No. 4,963,239; Nobutani et al., U.S. Pat. No. 4,964,962; Arita, U.S. Pat. No. 4,964,968; Kusakabe et al., U.S. Pat. No. 4,964,969 and Hata, U.S. Pat. No. 4,971,674; and the references referred to therein; sputtering targets are discussed also in Fukasawa et al., U.S. Pat. Nos. 4,963,240 and 4,966,676; and Archut et al., U.S. Pat. No. 4,966,677. These disclosures of sputtering processes and apparatus as well as sputtering targets are expressly incorporated herein by reference.

The effect of crystallographic orientation of a sputtering target on sputtering deposition rate and film uniformity has been described in an article by C. E. Wickersham, Jr. entitled *Crystallographic Target Effects in Magnetron Sputtering* in the J.Vac. Sci. Technol. A5(4), July/August 1987 publication of the American Vacuum Society. In this article the author indicates that improvements in film uniformity may be achieved on a silicon wafer by controlling the working process for making a target so that an optimum crystallographic orientation is maintained in the target; however, target grain size is indicated as significantly less important. Specifically, aluminum alloy targets fabricated with different crystallographic orientations were examined and reported upon in the article. The crystallographic orientations were determined by X-ray diffraction pole figures.

Crystallographic orientation is also discussed in an article entitled *Drift in Film Uniformity Arising from Sputtering Target Recrystallization* by Haupt and C. E. Wickersham which appeared in the J. Vac.Sci.Technol A7 May/June 1989 publication of the American Vacuum Society. This article indicates that target recrystallization can be a significant source of thickness uniformity variation in sputtering operations but emphasizes the importance believed to be attributed to operating temperature of the target and the target recrystallization temperatures.

In an article entitled *Aluminum Alloys for Present and Future Devices*, by Daniel R. Marx published by the Materials Research Corporation (1990) aluminum alloys to be used in semiconductor devices are discussed and it is indicated that controlled thermomechanical processes can produce fine grained target structures but that the simple application of conventional hot working is accompanied by some undesirable effects which will tend to cause arcing during sputtering.

The disclosures of the foregoing articles are also expressly incorporated herein by reference.

The present invention provides an aluminum target suitable for magnetron sputtering which results in improved deposition rate and improved thickness uniformity of the coating or film applied to a substrate.

SUMMARY OF THE INVENTION

In accordance with the present invention there is provided an aluminum target usefully in magnetron sputtering which comprises a body of aluminum or aluminum alloy having a grain size of less than 2 mm and <110> fiber texture wherein the fiber axis directed towards the object to be coated by magnetron sputtering has an X-ray diffraction intensity greater than 20 times random. Also provided in accordance with the invention is a method of making an aluminum target for magnetron sputtering which comprises:

providing a body of fine grain aluminum or aluminum alloy having a grain size of less than 2 mm;

heating the body to an elevated forging temperature in the range of 550° to 900° F.; and slow forging the body at the rate of 0.5 to 4 inches per minute to produce <110> fiber texture wherein the fiber axis directed towards the object to be coated has an X-ray diffraction intensity greater than 20 times random.

DETAILED DESCRIPTION OF THE INVENTION

Figure 1:
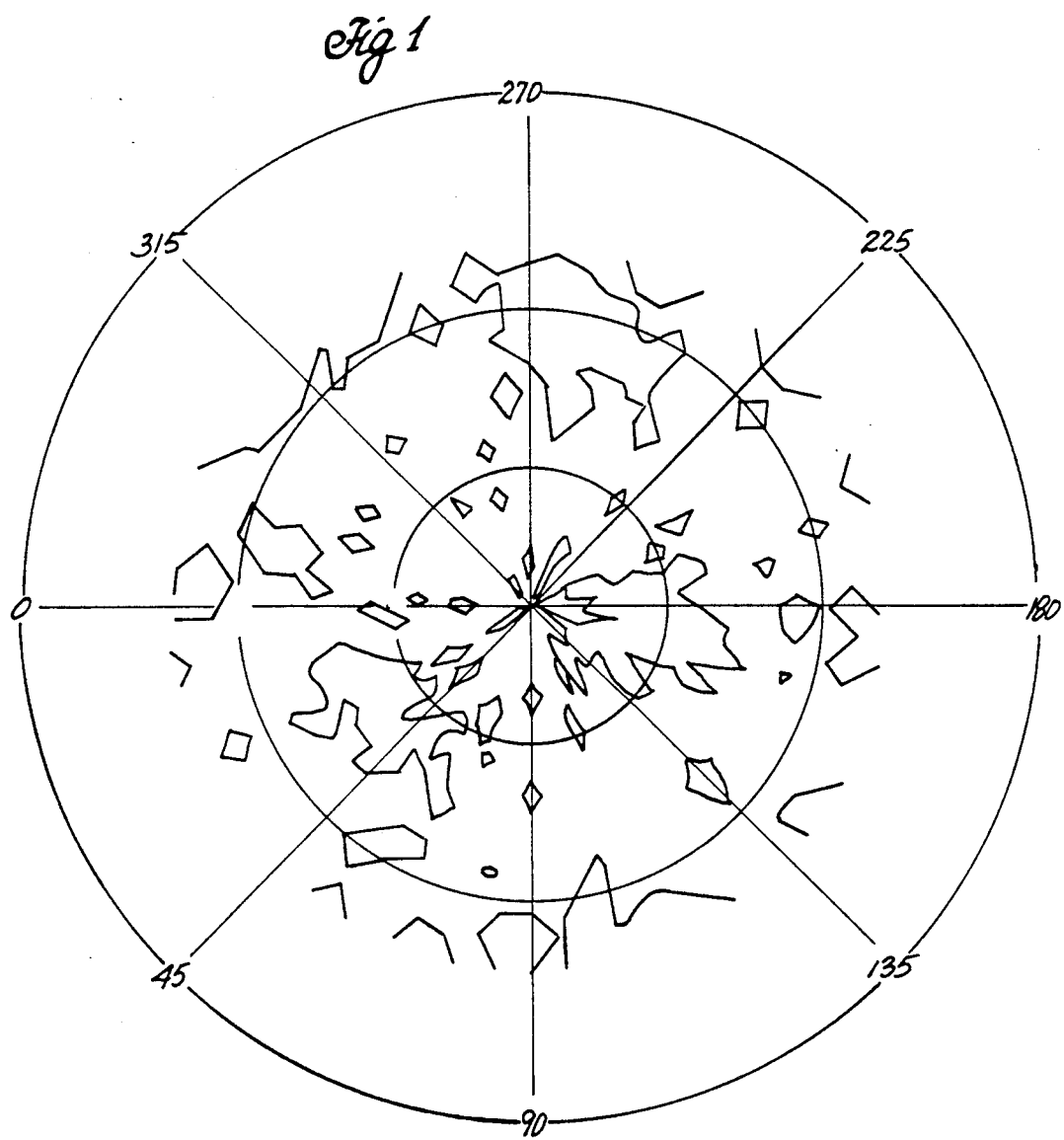
FIG. 1 is a schematic diagram of a pole figure of a randomly oriented aluminum target obtained by X-ray diffraction.

Aluminum targets that are commonly available to the industry typically have a grain size of about 3 mm or greater with random crystallographic orientation. Such targets are obtained by casting and rolling aluminum followed by recrystallization heat treatment at an elevated temperature. The aluminum is available in the form of a billet which is then cut to size and machined to produce a suitable aluminum target. Various aluminum compositions may be used; from high purity aluminum to various aluminum alloys. Useful aluminum alloys for targets may contain, for example, silicon and copper in small amounts.

High purity aluminum used in the electronic industry tends to form a large grain size during solidification. In most cases, the purer the aluminum the larger the grain size. Alloy elements added to aluminum such as may be used in the manufacturing of targets for the electronic industry generally have little grain refining effect. Grain refiners used by the aluminum industry, such as titanium boride, cannot be used in the electronics industry because they contaminate the target with resulting contamination of the coating of film deposited on a substrate.

However, fine grain aluminum and aluminum alloys can be produced by the aluminum industry by cold deformation followed by recrystallization. Fine grain aluminum can also be produced by special casting techniques such as, for example, by stirring during casting by mechanical, electro-magnetic, or ultrasonic means.

The present invention utilizes in the preferred embodiment, as a starting material, a fine grain aluminum casting generally produced by mechanical stirring during the casting process. However, any fine grain aluminum starting material may be employed. The term "fine grain" as used herein refers to aluminum and/or aluminum alloys having a grain size not greater than 2 mm.

The preferred orientation in the <110> direction required by the invention is achieved by slowly hot forging a fine grained aluminum body under controlled conditions. It has been found that the necessary near 100% preferred orientation is achieved by heating the aluminum material prior to hot forging temperature to a temperature in the range of 550° to 900° F. and thereafter slow forging the heated aluminum body at a rate of 0.5 to 4 inches per minute to produce the preferred grain orientation in the <110> direction as described below. A preferred starting material for the process is a fine grain aluminum body which is in the form a continuously cast billet and has an average grain size of not greater than about 1 mm. After the fine grain aluminum body with preferred orientation is produced, suitable targets may be cut therefrom to any desired size for a particular sputtering process.

In accordance with the invention, the target of aluminum or aluminum alloy has <110> fiber texture wherein the fiber axis directed toward the object to be coated by magnetron sputtering, which may be a wafer such as a silicon wafer, has an X-ray diffraction intensity greater than 20 times random. "Fiber texture" means the preferred orientation, i.e., alignment of the crystal lattice when one axis of the crystal lattice is fixed, in this case in the <110> direction. The fixed axis is called the "fiber axis" and the crystals are randomly oriented in the plane normal to the fiber axis. Thus, "fiber texture" exhibits rotational symmetry around the "fiber axis". The invention involves a preferred orientation wherein the fiber axis directed toward the object to be coated by magnetron sputtering has an X-ray diffraction intensity at least 20 times higher than the X-ray diffraction intensity of a randomly oriented sample of the same composition, usually in powder form.

Figure 2:
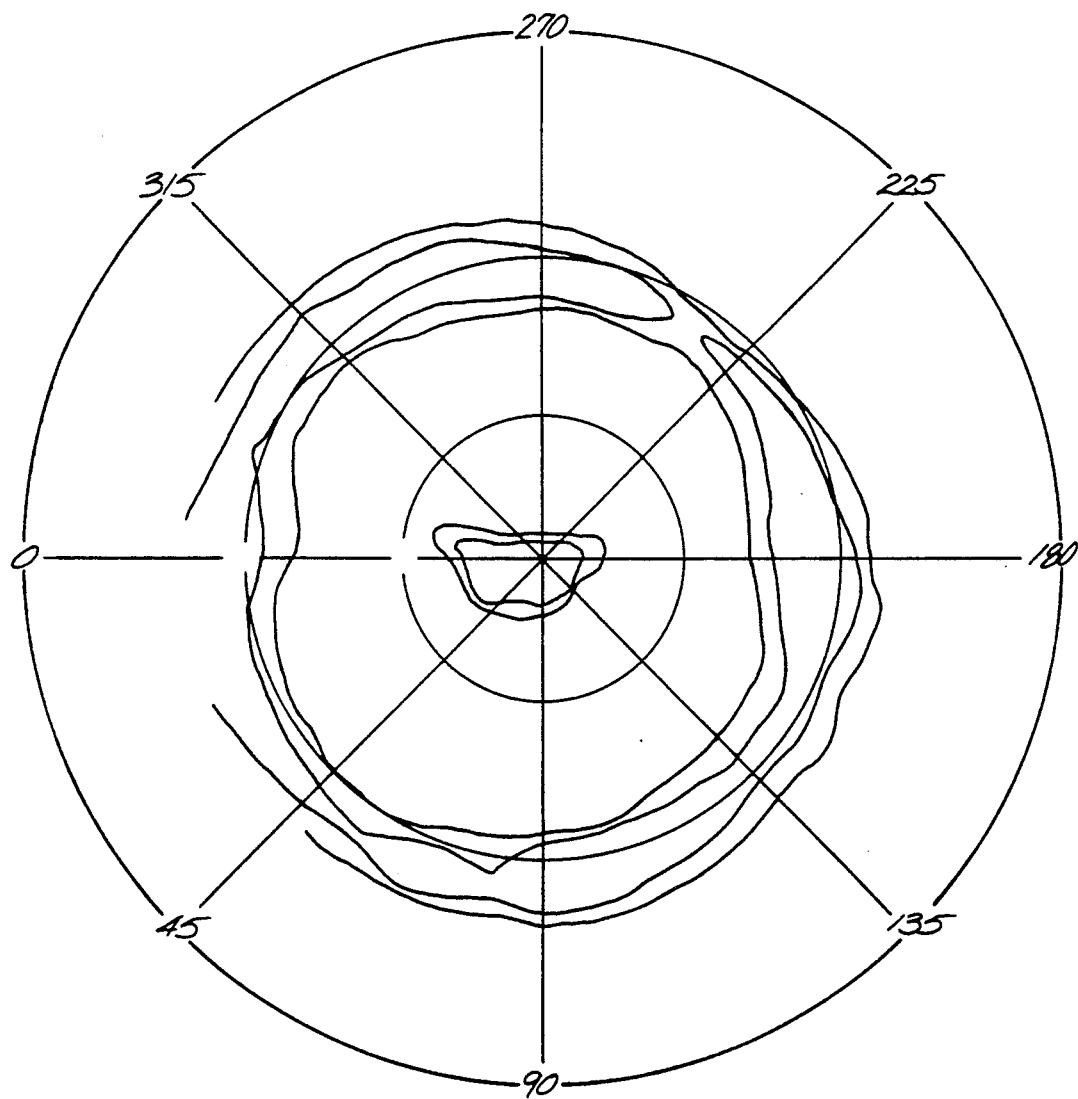
FIG. 2 is a schematic diagram of a pole figure of an aluminum target having the preferred orientation in the <110> direction in accordance with the invention, obtained by X-ray diffraction.

As a specific example of the invention, a continuously cast billet 4 inches in diameter and 5 to 6 feet in length of high purity aluminum or aluminum alloy with Si and/or Cu is provided having an average grain size of about 1 mm. The billet is cut into 7-inch lengths to produce a cylinder 4×7 inches and with the aforementioned grain size of 1 mm. The cylinders are heated in an oven to 572° F. and then placed on a heated forge where they are slowly forged from a thickness of 7 inches to a thickness of 1½ inches with the diameter increasing to about 8½ inches. The 8 ½×1½ inch cylinder is then machined to provide flat surfaces useful for a sputtering target. The grain size after forging and machining remains at an average of about 1 mm, as was the starting material, but the grains achieve a near ideal orientation in the <110> direction as determined by X-ray diffraction and mapping. A typical pole figure showing the preferred grain orientation is described in FIG. 2 which may be compared to the diagram in FIG. 1 which shows random orientation of grains.

It is apparent that the process described above maximizes the <110> orientation perpendicular to the sputtering target. This orientation is the closed-packed density (in aluminum and other cubic faced crystals), and results in maximizing deposition rates during sputtering. Forging in the axial compression direction tends to orient the aluminum grain into the <110> direction parallel to the axis of deformation. Slow deformation rates and high temperatures maximize this effect.

To illustrate the improvement achieved by the invention, aluminum targets made as described above were subjected to sputtering tests and compared with conventional aluminum targets that did not have preferred orientation in the <110> direction and fine grain size. Thickness uniformity of the coating applied by sputtering of aluminum targets containing 1% silicon under argon pressure of 7 mm, applied power of 9.6 kw, wafer temperature of 325° C. in a Varian 3180 sputtering device showed a film deposition thickness uniformity produced by the target of the invention of ±4.4 to 4.6%. In contrast, thickness uniformity using a conventional target under similar conditions was in the range of ±4.0 to 8%. Improvements have also been observed in the deposition rate, which is very important in the high speed production of integrated circuits.

It is apparent from the foregoing that various changes and modifications may be made to the invention with departing from the spirit thereof.

Accordingly, the invention should be limited only by the appended claims wherein what is claimed is:

1. An aluminum target suitable for magnetron sputtering comprising a body of aluminum or aluminum alloy, said target having a grain size of less than 2 mm and <110> fiber texture wherein the fiber axis directed towards the object to be coated by magnetron sputtering has an X-ray diffraction intensity greater than 20 times random.

2. An aluminum target according to claim wherein said body comprises one of the group consisting of high purity aluminum, an alloy of aluminum and copper, an alloy of aluminum and silicon and an alloy of aluminum and copper and silicon.

3. An aluminum target according to claim 1 wherein the grain size of the target is not greater than about 1 mm.

4. A method of making an aluminum target suitable for magnetron sputtering comprising:
providing a body of fine grain aluminum or aluminum alloy having a grain size of less than 2 mm;
heating said body to an elevated forging temperature in the range of 550° to 900° F.; and
slow forging said body at a rate of 0.5 to 4 inches per minute to produce <110> fiber texture, wherein the fiber axis has an X-ray diffraction intensity greater than 20 times random.

5. A method according to claim 4 wherein said fine grain aluminum body is a continuously cast billet with an average grain size of not greater than about 1 mm, further comprising cutting said body after forging and machining the surface of the hot forged body to produce a sputtering target of desired size.

* * * * *

UNITED STATES PATENT AND TRADEMARK OFFICE
CERTIFICATE OF CORRECTION

PATENT NO. : 5,087,297
DATED : February 11, 1992
INVENTOR(S) : Benoit Pouliquen

It is certified that error appears in the above-identified patent and that said Letters Patent is hereby corrected as shown below:

Column 4, line 43, after "claim" insert -- 1 --.

Signed and Sealed this

Twenty-ninth Day of June, 1993

Attest:

MICHAEL K. KIRK

Attesting Officer

Acting Commissioner of Patents and Trademarks